(12) United States Patent
Wang et al.

(10) Patent No.: US 10,784,445 B2
(45) Date of Patent: Sep. 22, 2020

(54) TEST SUBSTRATE AND MANUFACTURING METHOD THEREOF, DETECTION METHOD, DISPLAY SUBSTRATE AND DISPLAY DEVICE

(71) Applicant: BOE TECHNOLOGY GROUP CO., LTD., Beijing (CN)

(72) Inventors: Ling Wang, Beijing (CN); Cuili Gai, Beijing (CN); Pan Xu, Beijing (CN); Yicheng Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/405,726

(22) Filed: May 7, 2019

(65) Prior Publication Data
US 2019/0348606 A1    Nov. 14, 2019

(30) Foreign Application Priority Data
May 8, 2018  (CN) .......................... 2018 1 0433098

(51) Int. Cl.
| | | |
|---|---|---|
| H01L 21/00 | (2006.01) | |
| H01L 51/00 | (2006.01) | |
| H01L 27/32 | (2006.01) | |
| H01L 51/52 | (2006.01) | |
| H01L 51/56 | (2006.01) | |

(52) U.S. Cl.
CPC ...... *H01L 51/0031* (2013.01); *H01L 27/3246* (2013.01); *H01L 51/5206* (2013.01); *H01L 51/5221* (2013.01); *H01L 51/56* (2013.01)

(58) Field of Classification Search
CPC ............ H01L 51/0031; H01L 27/3246; H01L 51/5206
See application file for complete search history.

(56) References Cited

U.S. PATENT DOCUMENTS

| | | | |
|---|---|---|---|
| 10,249,699 B2* | 4/2019 | Huang .................. | G06F 3/0412 |
| 10,565,424 B2* | 2/2020 | Xin ........................ | G06K 9/001 |

(Continued)

FOREIGN PATENT DOCUMENTS

| | | |
|---|---|---|
| CN | 101202298 A | 6/2008 |
| CN | 103545457 A | 1/2014 |

(Continued)

OTHER PUBLICATIONS

First Office Action issued in corresponding Chinese Patent Application No. 201810433098.8, dated Mar. 27, 2020, with English translation.

*Primary Examiner* — Laura M Menz
(74) *Attorney, Agent, or Firm* — McDermott Will & Emery LLP

(57) ABSTRACT

A test substrate includes a base and a first electrode layer, a pixel defining layer, a light-emitting functional layer and a second electrode layer disposed on the base in sequence. The test substrate has at least two test regions, and each test region is a region where one first electrode of the plurality of first electrodes is located. Each test region includes a first region. Orthographic projections of portions of the pixel defining layer and the light-emitting functional layer located in a same first region on the base overlap with each other, and areas of orthographic projections of portions of the first electrode layer located in first regions of the at least two test regions are different.

20 Claims, 9 Drawing Sheets

(56) References Cited

U.S. PATENT DOCUMENTS

| | | | |
|---|---|---|---|
| 2008/0142807 A1 | 6/2008 | Choe et al. | |
| 2014/0367658 A1 | 12/2014 | Kwak | |
| 2016/0035802 A1 | 2/2016 | Wang et al. | |
| 2016/0329387 A1 | 11/2016 | Mohanan et al. | |
| 2017/0133620 A1* | 5/2017 | Lee | H01L 27/326 |
| 2017/0141169 A1 | 5/2017 | Sim et al. | |
| 2018/0301516 A1* | 10/2018 | Huang | G06F 3/0412 |
| 2018/0365471 A1* | 12/2018 | Xin | H01L 27/326 |
| 2019/0097167 A1 | 3/2019 | Sun et al. | |
| 2019/0102018 A1* | 4/2019 | Qin | G06F 3/0412 |
| 2019/0123304 A1* | 4/2019 | Liu | H01L 27/3213 |
| 2019/0348606 A1* | 11/2019 | Wang | H01L 51/0031 |

FOREIGN PATENT DOCUMENTS

| | | | |
|---|---|---|---|
| CN | 104241544 A | 12/2014 | |
| CN | 105900240 A | 8/2016 | |
| CN | 107611164 A | 1/2018 | |
| CN | 108649000 A * | 10/2018 | H01L 51/56 |

\* cited by examiner

A-A'

B-B'

TEST SUBSTRATE AND MANUFACTURING METHOD THEREOF, DETECTION METHOD, DISPLAY SUBSTRATE AND DISPLAY DEVICE

CROSS-REFERENCE TO RELATED APPLICATION

This application claims priority to Chinese Patent Application No. 201810433098.8, filed with the Chinese Patent Office on May 8, 2018, titled "TEST SUBSTRATE AND MANUFACTURING METHOD THEREOF, DETECTION METHOD, DISPLAY SUBSTRATE AND DISPLAY DEVICE", which is incorporated herein by reference in its entirety.

TECHNICAL FIELD

The present disclosure relates to the field of display technologies, and in particular, to a test substrate and a manufacturing method thereof, a detection method, a display substrate and a display device.

BACKGROUND

In recent years, organic light-emitting diodes (abbreviated as OLEDs) have been widely used in the display field due to their advantages of self-emission, wide viewing angle, short response, high light-emitting efficiency, wide color gamut and low operating voltage.

SUMMARY

In a first aspect, a test substrate is provided. The test substrate includes a base, and a first electrode layer, a pixel defining layer, a light-emitting functional layer and a second electrode layer disposed on the base in sequence. The first electrode layer includes a plurality of first electrodes, a portion of each first electrode is in contact with the light-emitting functional layer, and orthographic projections of the plurality of first electrodes on the base are located within an orthographic projection of the second electrode layer on the base. The test substrate has at least two test regions. Each test region is a region where a first electrode of the plurality of first electrodes is located. Each test region includes a first region. Orthographic projections of portions of the pixel defining layer and the light-emitting functional layer located in a same first region on the base overlap with each other. Areas of orthographic projections of portions of the first electrode layer located in first regions of the at least two test regions on the base are different.

In some embodiments, contact areas of at least two first electrodes in the at least two test regions and the light-emitting functional layer are the same.

In some embodiments, the pixel defining layer is provided with a plurality of openings in one-to-one correspondence with the plurality of first electrodes, and a portion of the light-emitting functional layer is filled in each of the plurality of openings. Each test region further includes an open region and a second region disposed on a side of the first region away from the open region. An orthographic projection of the pixel defining layer on the base is located outside an orthographic projection of the open region on the base. An orthographic projection of the light-emitting functional layer on the base is located outside an orthographic projection of the second region on the base.

In some embodiments, areas of orthographic projections of at least two open regions of the at least two test regions on the base are the same.

In some embodiments, the test substrate further includes a plurality of barrier walls configured to enclose a plurality of regions. The plurality of barrier walls are disposed on a surface of the pixel defining layer away from the base and a surface of the first electrode layer away from the base and not covered by the pixel defining layer, respectively. The light-emitting functional layer includes a plurality of light-emitting films, and one of the plurality of light emitting films is disposed in a corresponding region of the plurality of regions enclosed by the plurality of barrier walls.

In some embodiments, each test region further includes a third region. Orthogonal projections of portions of the pixel defining layer and the plurality of barrier walls located in a same third region on the base overlap with each other.

In some embodiments, the portions of the first electrode layer located in the first regions of the at least two test regions are provided with different numbers of through holes.

In some embodiments, the through holes have a same shape and a same size.

In a second aspect, a display substrate including the test substrate according to the first aspect is provided.

In a third aspect, a display device including the display substrate according to the second aspect is provided.

In a fourth aspect, a detection method for detecting a capacitance of the test substrate according to the first aspect is provided. The detection method includes: selecting at least two test regions in the test substrate, wherein areas of orthogonal projections of portions of the first electrode layer located in first regions of the at least two test regions on a base are different; detecting each test region of the at least two test regions, and obtaining a measured capacitance between a first electrode and a portion of a second electrode layer disposed opposite to the first electrode in each test region; and determining capacitance per unit area of first region according to the measured capacitance corresponding to the first electrode in each test region and area of orthographic projection of a portion of the first electrode located in a first region of each test region on the base.

In some embodiments, contact areas of first electrodes in different test regions and the light-emitting functional layer are the same.

In some embodiments, determining the capacitance per unit area of first region, includes: using the area of the orthographic projection of the portion of the first electrode located in the first region of each test region on the base as independent variable, and using the measured capacitance corresponding to the first electrode in each test region as a dependent variable to fit a linear function; and determining a slope of the linear function, and the slope being the capacitance per unit area of first region.

In some embodiments, determining the capacitance per unit area of first region, includes: determining the capacitance per unit area of the first region of each test region according to the measured capacitance corresponding to the first electrode of each test region and the area of the orthographic projection of the portion of the first electrode located in the first region on the base; and averaging capacitances per unit area of the first regions of the at least two test regions to obtain an average capacitance per unit area of first region.

In a fifth aspect, a method of manufacturing a test substrate is provided. The method includes: providing a base; forming a first electrode layer on the base, wherein the first electrode layer includes a plurality of first electrodes; forming a pixel defining layer on the first electrode layer; forming a light-emitting functional layer on a side of the pixel defining layer away from the first electrode layer, wherein a portion of each first electrode is in contact with the light-emitting functional layer; and forming a second electrode layer on the light-emitting functional layer, wherein orthographic projections of the plurality of first electrodes on the base are located within an orthographic projection of the second electrode layer on the base, wherein a region where a first electrode is located is a test region, and the test region includes a first region, orthographic projections of portions of the pixel defining layer and the light-emitting functional layer located in a same first region on the base overlap with each other; and areas of orthographic projections of portions of first electrode layer located in first regions of the at least two test regions are different.

In some embodiments, forming the first electrode layer on the base, includes: forming a conductive film on the base; etching the conductive film to form a plurality of conductive electrodes having a same shape and a same size; and etching portions of the plurality of conductive electrodes located in corresponding first regions to form the plurality of first electrodes.

In some embodiments, forming the first electrode layer on the base, includes: forming a conductive film on the base; and etching the conductive film to form the plurality of first electrodes.

In some embodiments, forming the pixel defining layer on the first electrode layer, includes: forming the pixel defining layer on a surface of the base not covered by the plurality of first electrodes and surfaces of the plurality of first electrodes away from the base, and forming a plurality of openings in one-to-one correspondence with the plurality of first electrodes in the pixel defining layer, wherein a portion of the pixel defining layer covering the first electrode located in a corresponding test region is located in a first region and a second region of the test region; and an orthographic projection of the light-emitting functional layer on the base is located outside an orthographic projection of the second region on the base.

In some embodiments, forming the light-emitting functional layer on the side of the pixel defining layer away from the first electrode layer, includes: forming the light-emitting functional layer on surfaces of the plurality of first electrodes that are not covered by the pixel defining layer and a part of a surface of the pixel defining layer away from the base, wherein a portion of the light-emitting functional layer covering the first electrode of a corresponding test region is located in an open region of the test region; and areas of orthographic projections of open regions of different test regions on the base are the same.

In some embodiments, after forming the pixel defining layer and before forming the light-emitting functional layer, the method further includes: forming a plurality of barrier walls on a surface of the pixel defining layer away from the base and surfaces of the plurality of first electrodes not covered by the pixel defining layer. The light-emitting functional layer includes a plurality of light-emitting films; and forming the light-emitting functional layer on the side of the pixel defining layer away from the first electrode layer, includes: forming a light-emitting film in each of at least one region of a plurality of regions enclosed by the plurality of barrier walls, wherein portions of the plurality of barrier walls corresponding to the pixel defining layer in a corresponding test region are located in a third region of the test region.

BRIEF DESCRIPTION OF THE DRAWINGS

In order to describe technical solutions in embodiments of the present disclosure more clearly, the accompanying drawings to be used in the description of disclosure will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in some embodiments of the present disclosure will be described clearly and completely with reference to the accompanying drawings in some embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

In an organic light-emitting diode (OLED) display device, a capacitance of an OLED plays an important role in a change of a source voltage of a driving transistor coupled to the OLED. For example, the larger the capacitance of the OLED is, the slower charge and discharge speeds of the source voltage of the driving transistor are. Therefore, a simulation model corresponding to the OLED display device may be effectively constructed by measuring the capacitance of the OLED in the OLED display device.

However, a large portion of the capacitance of the OLED currently measured by using an OLED life test cell (LTC) is parasitic capacitance, so that when a simulation model is constructed based on the capacitance of the OLED measured by using the OLED LTC, the charge and discharge speeds of the source voltage of the driving transistor in the simulation model are likely to be slow, thereby resulting in a large simulation error, especially in a case of simulating a large-area display panel.

Figure 1:
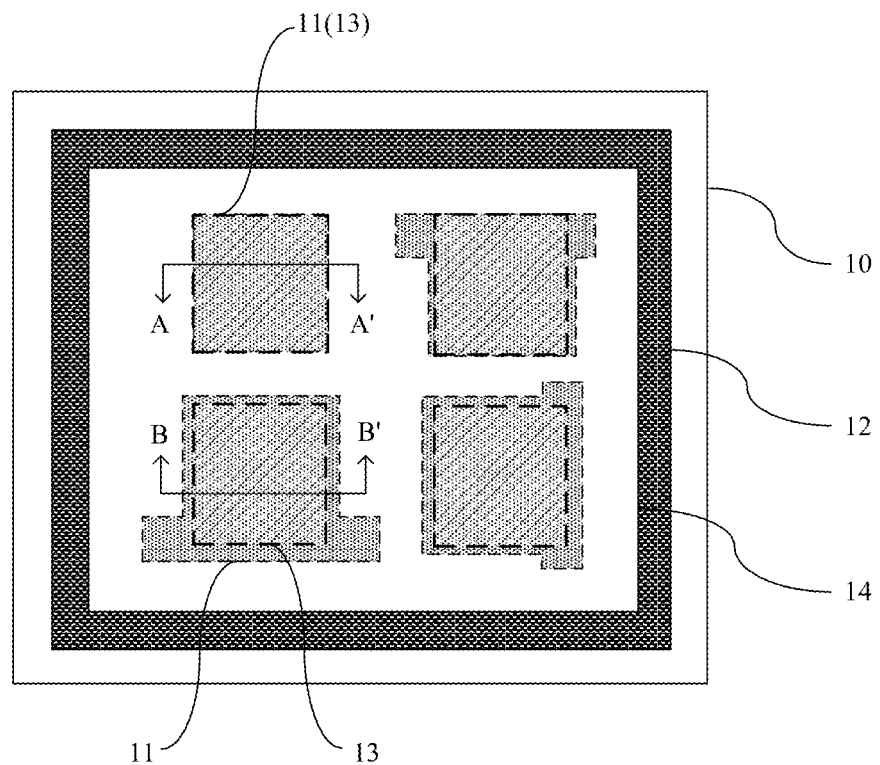
FIG. 1 is a schematic structural diagram of a test substrate, in accordance with some embodiments.
Figure 2:
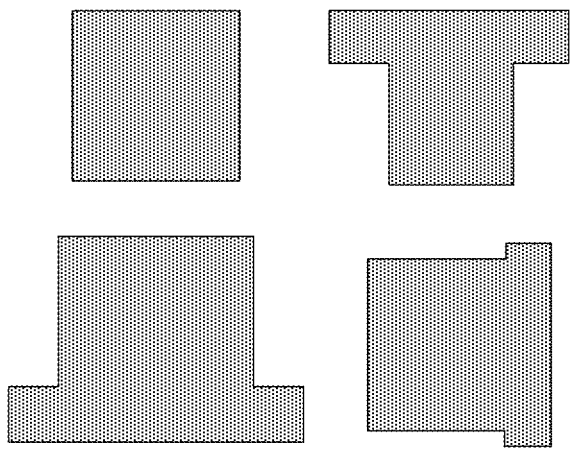
FIG. 2 is a schematic structural diagram of a first electrode layer of the test substrate shown in FIG. 1, in accordance with some embodiments.
Figure 3:
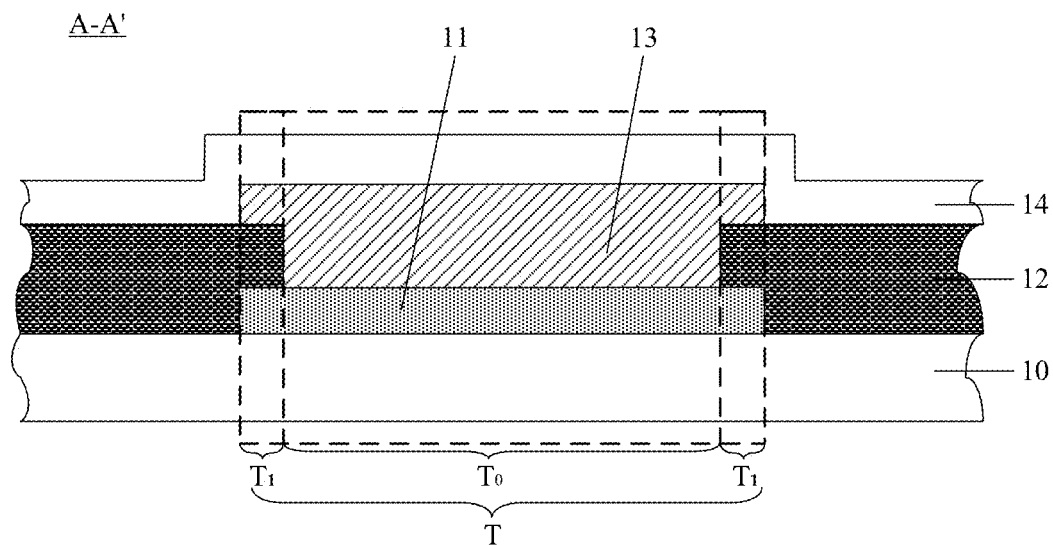
FIG. 3 is a cross-section diagram of the test substrate taken along line A-A' shown in FIG. 1, in accordance with some embodiments.

Based on this, some embodiments of the present disclosure provide a test substrate. With reference to FIGS. 1-3, the test substrate includes a base 10, and a first electrode layer 11, a pixel defining layer (abbreviated as PDL) 12, a light-emitting functional layer (abbreviated as EL) 13 and a second electrode layer 14 disposed on the base 10 in sequence. The first electrode layer 11 includes a plurality of first electrodes, a portion of each first electrode is in contact with the light-emitting functional layer 13, and orthographic projections of the plurality of first electrodes on the base 10 are located within an orthographic projection of the second electrode layer 14 on the base 10.

The plurality of first electrodes of the first electrode layer 11 have a same or different shapes, which some embodiments of the present disclosure do not limit. The plurality of first electrodes are disposed opposite to the second electrode layer 14, and each first electrode and the second electrode layer 14 are configured such that the first electrode and a portion of the second electrode layer 14 disposed opposite to the first electrode may control the portion of the light-emitting functional layer 13 in contact with the first electrode to emit light after being energized. Optionally, the second electrode layer 14 includes a plurality of second electrodes in one-to-one correspondence with the plurality of first electrodes. An orthographic projection of each first electrode on the base 10 is located within an orthographic projection of a corresponding second electrode on the base 10. Alternatively, the second electrode layer 14 is an entire conductive film covering a surface of the light-emitting functional layer 13 away from the base 10 and a surface of the pixel defining layer 12 not covered by the light-emitting functional layer 13.

The test substrate has at least two test regions T, and each test region T is a region where a corresponding first electrode of the plurality of first electrodes is located. Here, the region where the corresponding first electrode is located refers to a region where an orthographic projection of the first electrode on the base 10 is located. Since the orthographic projections of the plurality of first electrodes on the base 10 are located within the orthographic projection of the second electrode layer 14 on the base 10, an orthographic projection of a first electrode located in each test region T on the base 10 overlaps with an orthographic projection of a portion of the second electrode layer 14 located in the test region T on the base 10.

Each test region T includes a first region $T_1$, and orthographic projections of portions of the pixel defining layer 12 and the light-emitting functional layer 13 located in a same first region $T_1$ on the base 10 overlap with each other. Areas of orthographic projections of portions of at least two first electrodes, which are located in corresponding first regions, in the at least two test regions T on the base 10 are different. That is, areas of orthographic projections of the at least two first regions in the at least two test regions T on the base 10 are different. In addition, in some examples, contact areas of the at least two first electrodes in the at least two test regions T and the light-emitting functional layer 13 are the same. In some examples, the first region $T_1$ includes one or more first sub-regions, and the position, the shape and the area of each first sub-portion are set according to the settings of the pixel defining layer 12 and the light-emitting functional layer 13 or according to the actual needs.

Portions of the test substrate located in each test region T (including at least portions of the first electrode layer 11, the pixel defining layer 12, the light-emitting functional layer 13 and the second electrode layer 14 located in the test region T) correspond to a life test cell (abbreviated as LTC). The LTC may be used to test electrical, optical and lifetime properties of the test region. In some embodiments, LTCs corresponding to the at least two test regions T are configured to test a capacitance of the test substrate.

As shown in FIG. 3, the pixel defining layer 12 is provided with a plurality of openings in one-to-one correspondence with the plurality of first electrodes of the first electrode layer 11, and a portion of the light-emitting functional layer 13 is filled in a corresponding one of the plurality of openings and is in contact with a corresponding first electrode (that is, a portion of the light-emitting functional layer 13 is electrically connected to the corresponding first electrode). In this way, each test region T further includes an open region $T_0$, which is a region where a corresponding opening of the pixel defining layer 12 is located, that is, the open region $T_0$ is a projection region of the corresponding opening of the pixel defining layer 12 in the direction perpendicular to the base 10 in the test substrate.

As shown in FIG. 3, an orthographic projection of the pixel defining layer 12 on the base 10 is located outside an orthographic projection of the open region $T_0$ on the base 10. Here, the orthographic projection of the pixel defining layer 12 on the base 10 refers to an orthographic projection of a solid portion of the pixel defining layer 12 on the base 10. Thus, the first electrode layer 11, the light-emitting functional layer 13 and the second electrode layer 14 each have portions disposed in the open region $T_0$ and the first region $T_1$. The pixel defining layer 12 has a portion disposed in the first region $T_1$ and does not have a portion disposed in the open region $T_0$.

It will be added that the test substrate described above may also be configured for a display use in addition to a test use. For example, each of the plurality of openings provided in the pixel defining layer 12 is configured to define a pixel region of the test substrate, and the plurality of openings have a same shape and a same size (including a cross-sectional perimeter and a cross-sectional area, etc.). Correspondingly, areas of orthographic projections of open regions $T_0$ in the test substrate on the base 10 are equal.

It will be understood that if the test substrate described above is used for testing, it is not necessary to provide driving transistors each configured to drive a first electrode in a corresponding test region T of the test substrate. Thus, when testing the test substrate, a first electrode in each test region T is electrically connected to a first metal layer, the second electrode layer 14 is electrically connected to a second metal layer, and different potentials are respectively applied to the first metal layer and the second metal layer via probes, so that potentials on each first electrode and the second electrode layer 14 are different, so as to complete a capacitance test of each LTC in the test substrate.

For example, in each test region T, the potentials on the first electrode and the second electrode layer 14 are different, the first electrode and the second electrode layer 14 are configured such that the first electrode and a portion of the second electrode layer 14 disposed opposite to the first electrode form a capacitor, and a capacitance of the capacitor is a measured capacitance of a LTC corresponding to the test region T. Portions of the first electrode and the second electrode layer 14 located in the open region $T_0$ have a capacitance due to the light-emitting functional layer 13, which is an effective capacitance of the LTC, and portions of the first electrode and the second electrode layer 14 located in the first region $T_1$ has a capacitance due to the pixel defining layer 12 and the light-emitting functional layer 13, which is a parasitic capacitance of the LTC.

In a process of testing the capacitance of each LTC in the test substrate, the measured capacitance $C_T$ of each LTC is at least a sum of the effective capacitance and the parasitic capacitance described above. That is, $C_T$ is a sum of a product of $C_{EL}$ and $S_0$ and a product of $C_{PDL\&EL}$ and $S_1$ ($C_T=C_{EL}\times S_0+C_{PDL\&EL}\times S_1$), wherein $S_0$ is an area of an orthographic projection of an open region $T_0$ of a test region T corresponding to the LTC on the base 10, $C_{EL}$ is a capacitance per unit area of the open region $T_0$, the product of $C_{EL}$ and $S_0$ is an effective capacitance of portions of the first electrode and the second electrode layer 14 located in the open region $T_0$ due to the light-emitting functional layer 13, $S_1$ is an area of an orthographic projection of a first region $T_1$ of the test region T corresponding to the LTC on the base 10, $C_{PDL\&EL}$ is a capacitance per unit area of the first region $T_1$, and the product of $C_{PDL\&EL}$ and $S_1$ is a parasitic capacitance of portions of the first electrode and the second electrode layer 14 located in the first region $T_1$ due to the pixel defining layer 12 and the light-emitting functional layer 13.

Since the pixel defining layer 12 and the light-emitting functional layer 13 are disposed between the portions of the first electrode and the second electrode layer 14 located in the first region $T_1$, the parasitic capacitance $C_{PDL\&EL}\times S_1$ may be generated between the portions of the first electrode and the second electrode layer 14 located in the first region $T_1$ during the testing process. Moreover, the pixel defining layer 12 and the light-emitting functional layer 13 have different dielectric coefficients, and the dielectric coefficient of the light-emitting functional layer 13 is easily affected by a manufacturing process thereof. Therefore, it is difficult to accurately obtain the parasitic capacitance $C_{PDL\&EL}\times S_1$ according to the dielectric coefficients of the pixel defining layer 12 and the light-emitting functional layer 13.

Based on this, in some embodiments, the measured capacitances $C_T$ of at least two LTCs are known, and the capacitance per unit area of first region $T_1$ may be determined according to different areas of orthographic projections of portions of first electrodes located in first regions $T_1$ corresponding to the at least two LTCs on the base 10, thereby obtaining a parasitic capacitance $C_{PDL\&EL}\times S_1$ of any LTC corresponding to a corresponding first region $T_1$.

For example, it is known that the measured capacitances $C_T$ of two LTCs are a first measured capacitance $C_{T1}$ corresponding to a first test region and a second measured capacitance $C_{T2}$ corresponding to a second test region, respectively. Areas of orthographic projections of open regions $T_0$ of the first test region and the second test region on the base 10 are both $S_0$, an area of an orthographic projection of a first region $T_1$ of the first test region on the base 10 is $S_{11}$, and an area of an orthographic projection of a first region $T_1$ of the second test region on the base 10 is $S_{12}$. Thus, assuming that a capacitance per unit area of each LTC corresponding to the open region $T_0$ is $C_{EL}$, according to a calculation formula of the first measured capacitance $C_{T1}$: $C_{T1}=C_{EL}\times S_0+C_{PDL\&EL}\times S_{11}$, and a calculation formula of the second measured capacitance $C_{T2}$: $C_{T2}=C_{EL}\times S_0+C_{PDL\&EL}\times S_{12}$, it may be known that a difference of $C_{T2}$ and $C_{T1}$ is a product of $C_{PDL\&EL}$ and a difference of $S_{12}$ and $S_{11}$ ($C_{T2}-C_{T1}=C_{PDL\&EL}\times(S_{12}-S_{11})$), and it may be further known that a capacitance per unit area of the first region $T_1$, i.e., $C_{PDL\&EL}$, is a quotient of a difference of $C_{T2}$ and $C_{T1}$ divided by a difference of $S_{12}$ and $S_{11}$ ($C_{PDL\&EL}=(C_{T2}-C_{T1})/(S_{12}-S_{11})$).

Of course, if the areas of the orthographic projections of the open regions $T_0$ of the first test region and the second test region on the base 10 are different, it is necessary to first determine the capacitance per unit area $C_{EL}$ of each LTC corresponding to the open region $T_0$ according to the dielectric coefficient of the light-emitting functional layer 13. That is, it is necessary to determine an effective capacitance $C_{EL}\times S_0$ of each LTC corresponding to a corresponding open region $T_0$. Then, a capacitance per unit area $C_{PDL\&EL}$ of any LTC corresponding to a corresponding first region $T_1$ is obtained through a subtraction calculation formula of the first measured capacitance $C_{T1}$ and the second measured capacitance $C_{T2}$.

As will be seen from the above, through providing the areas of the orthographic projections of the portions of the first electrodes located in the corresponding first regions $T_1$ of the at least two test regions T on the base 10 to be different, the parasitic capacitance corresponding to each first region $T_1$ may be effectively extracted in a case where portions of the pixel defining layer 12 and the light-emitting functional layer 13 are simultaneously provided in the first region $T_1$, thereby accurately constructing a simulation model corresponding to the test substrate, so as to avoid a problem of a large simulation error due to a fact of constructing the simulation model by directly using the measured capacitance $C_T$, which is advantageous for improving a simulation accuracy of the simulation model.

In addition, In some embodiments, the test substrate is an OLED display substrate, or design specifications of an OLED display substrate for mass production are the same as design specifications of the test substrate, and the measured capacitance $C_T$ is a capacitance of a corresponding OLED (i.e., $C_T$ equals $C_{OLED}$) of the OLED display substrate. The fact that the design specifications of the OLED display substrate for mass production are the same as the design specifications of the test substrate described above refers to that a ratio of a portion of the pixel defining layer 12 located in the first region $T_1$ to a portion of the light-emitting functional layer 13 located in the first region $T_1$ in the OLED display substrate for mass production is the same as a ratio of a portion of the pixel defining layer 12 located in the first region $T_1$ to a portion of the light-emitting functional layer 13 located in the first region $T_1$ in the test substrate. Moreover, since the dielectric coefficient of the light-emitting functional layer 13 is easily affected by the manufacturing process, the manufacturing processes and manufacturing parameters of the light-emitting functional layers 13 in the OLED display substrate for mass production and in the test substrate are the same.

It will be added that the measured capacitance $C_T$ of any LTC described above may be directly measured by a capacitance measuring device such as a multimeter. In addition, the measured capacitance $C_T$ of any LTC in the test substrate needs to be measured when the LTC is in an off state. The fact that the LTC is in an off state means that the first electrode and the second electrode layer 14 have different potentials, and a portion of the light-emitting functional layer 13 included in the LTC is in a non-light-emitting state. If the LTC is in an on state, that is, the portion of the light-emitting functional layer 13 included in the LTC is in a light-emitting state, the measured capacitance of the LTC is easily affected, thereby causing that the measured capacitance $C_T$ is not accurate.

Figure 4:
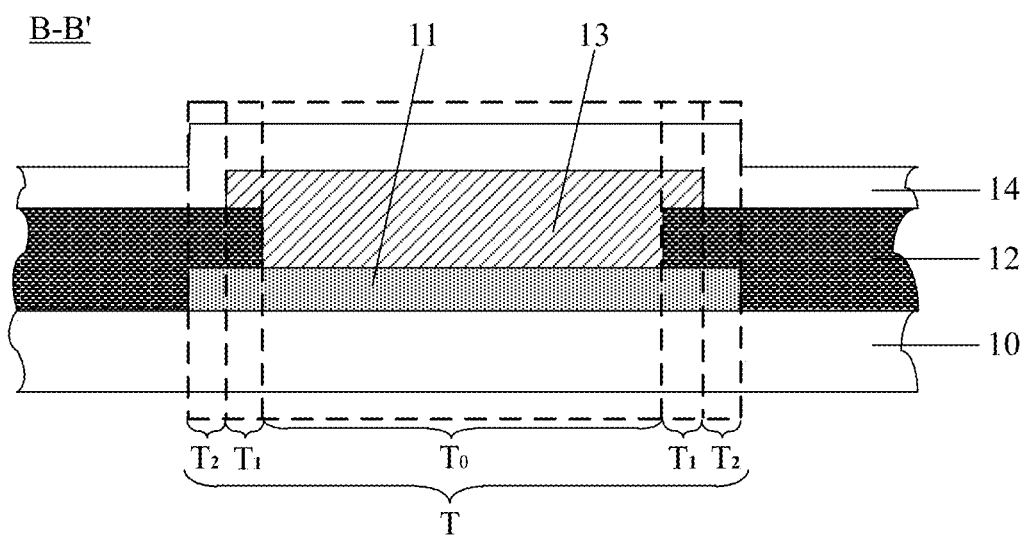
FIG. 4 is a cross-section diagram of the test substrate taken along line B-B' shown in FIG. 1, in accordance with some embodiments.

In some embodiments, as shown in FIG. 4, each test region T further includes a second region $T_2$ disposed on a side of the first region $T_1$ away from the open region $T_0$. An orthographic projection of the light-emitting functional layer 13 on the base 10 is located outside an orthographic projection of the second region $T_2$ on the base 10. That is, the first electrode layer 11, the pixel defining layer 12 and the second electrode layer 14 each have portions disposed in the first region $T_1$ and the second region $T_2$. The light-emitting functional layer 13 has a portion disposed in the first region $T_1$ and does not have a portion disposed in the second region $T_2$. In addition, the first electrode layer 11, the light-emitting functional layer 13 and the second electrode layer 14 each also have a portion disposed in the open region $T_0$. Here, the light-emitting functional layer 13 includes a plurality of light-emitting films each provided in a block shape, which is advantageous for reducing an overall thickness of the test substrate. In some examples, the second region $T_2$ includes one or more second sub-regions, and the position, the shape and the area of each second sub-portion are set according to the settings of the pixel defining layer 12 and the light-emitting functional layer 13 or according to the actual needs.

It will be noted that in a case where the test region T of the test substrate further includes the second region $T_2$, a measured capacitance $C_T$ of a LTC corresponding to the test region T further includes a parasitic capacitance $C_{PDL} \times S_2$ between portions of the first electrode and the second electrode layer 14 located in the second region $T_2$ due to the pixel defining layer 12, wherein S2 is an area of an orthographic projection of the second region $T_2$ of the test region T corresponding to the LTC on the base 10, and $C_{PDL}$ is a capacitance per unit area of the second region $T_2$. That is, the measured capacitance $C_T$ of the LTC is a sum of a product of $C_{EL}$ and $S_0$, a product of $C_{PDL\ \&\ EL}$ and $S_1$ and a product of $C_{PDL}$ and $S_2$ ($C_T = C_{EL} \times S_0 + C_{PDL\&EL} \times S_1 + C_{PDL} \times S_2$). Since the pixel defining layer 12 is disposed between portions of the first electrode and the second electrode layer 14 located in the second region $T_2$, the parasitic capacitance $C_{PDL} \times S_2$ may be generated between the portions of the first electrode and the second electrode layer 14 located in the second region $T_2$ during the testing process. Moreover, an impact of the manufacturing process on the dielectric coefficient of the pixel defining layer 12 is negligible. Therefore, the capacitance per unit area $C_{PDL}$ of the second region $T_2$ may be accurately determined according to the dielectric coefficient of the pixel defining layer 12, and then a parasitic capacitance $C_{PDL} \times S_2$ of each LTC corresponding to a corresponding second region $T_2$ is determined. That is, a parasitic capacitance corresponding to each second region $T_2$ is effectively extracted, thereby accurately constructing the simulation model corresponding to the test substrate, so as to improve the simulation accuracy of the simulation model.

Figure 5:
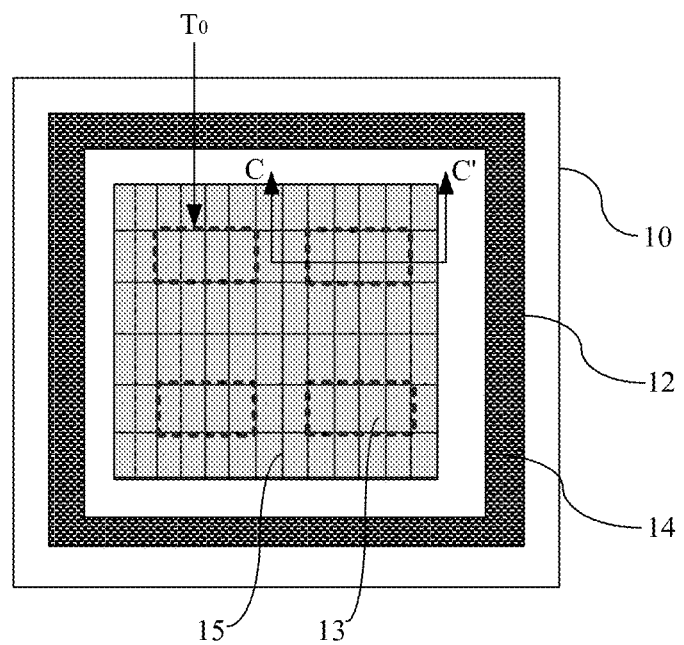
FIG. 5 is a schematic structural diagram of another test substrate, in accordance with some embodiments.
Figure 6:
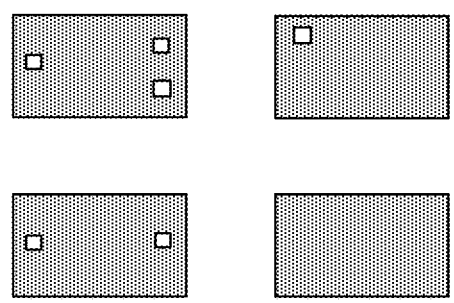
FIG. 6 is a top plan view of a first electrode layer of the test substrate shown in FIG. 5, in accordance with some embodiments.
Figure 7:
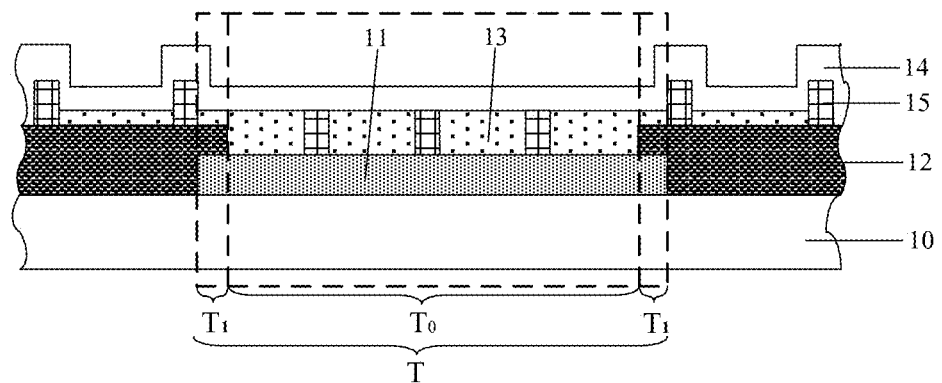
FIG. 7 is a cross-section diagram of the test substrate taken along line C-C' shown in FIG. 5, in accordance with some embodiments.

In some embodiments, with reference to FIGS. 5-7, the test substrate further includes a plurality of barrier walls 15 configured to enclose a plurality of regions. The plurality of barrier walls 15 are disposed on a surface of the pixel defining layer 12 away from the base 10 and a surface of the first electrode layer 11 away from the base 10 and not covered by the pixel defining layer 12, respectively. The light-emitting functional layer 13 includes a plurality of light-emitting films. One of the plurality of light-emitting films is located in a corresponding one of the plurality of regions enclosed by the plurality of barrier walls 15.

Providing the plurality of barrier walls 15 in the test substrate facilitates manufacturing the light-emitting functional layer 13 by using an inkjet printing process. For example, the plurality of barrier walls 15 are formed on the surface of the pixel defining layer 12 away from the base 10 and the surface of the first electrode layer 11 away from the base 10 and not covered by the pixel defining layer 12. A light-emitting film is formed in each of at least one region of the plurality of regions enclosed by the plurality of barrier walls 15 through the inkjet printing process, and the light-emitting functional layer 13 is formed by at least one light-emitting film in the at least one region.

Since in a process of manufacturing the light-emitting functional layer 13 through the inkjet printing process, a molding thickness of the light-emitting functional layer 13 is easily affected by a flatness of a film layer disposed on a side of the light-emitting functional layer 13 close to the base 10 (for example, the first electrode layer 11 or the pixel defining layer 12), at least one printing ink droplet of the light-emitting functional layer 13 may be dropped as required in a corresponding region enclosed by barrier walls 15 by using the plurality of barrier walls 15, so as to ensure that a thickness of the light-emitting film of the light-emitting functional layer 13 that is located in each region tends to be consistent (substantially the same), thereby ensuring that a thickness of an entire light-emitting functional layer 13 tends to be consistent.

Some embodiments of the present disclosure do not limit positions of the plurality of barrier walls 15. For example, the plurality of barrier walls 15 are disposed in the test regions T, or the plurality of barrier walls 15 are disposed in the test regions T and regions of the test substrate other than the test regions T. In addition, some embodiments of the present disclosure do not limit a material of the plurality of barrier walls 15. For example, the material of the plurality of barrier walls 15 is the same as or different from a material of the pixel defining layer 12. Optionally, the plurality of barrier walls 15 are made of an insulating material. Optionally, the plurality of barrier walls 15 are integrally formed with the pixel defining layer 12.

It will be understood that in a case where the test substrate includes the plurality of barrier walls 15, a first region $T_1$ of each test region T may be divided into a plurality of smaller block-shaped regions by the barrier walls 15. In this case, first regions $T_1$ of different test regions $T_1$ may have the same shape and the same area. Based on this, in some embodiments, as shown in FIG. 6, a portion of the first electrode located in the first region $T_1$ has one or more through holes, and areas of orthographic projections of portions of the first electrodes located in the first regions $T_1$ of different test regions $T_1$ on the base 10 are different.

Figure 8:
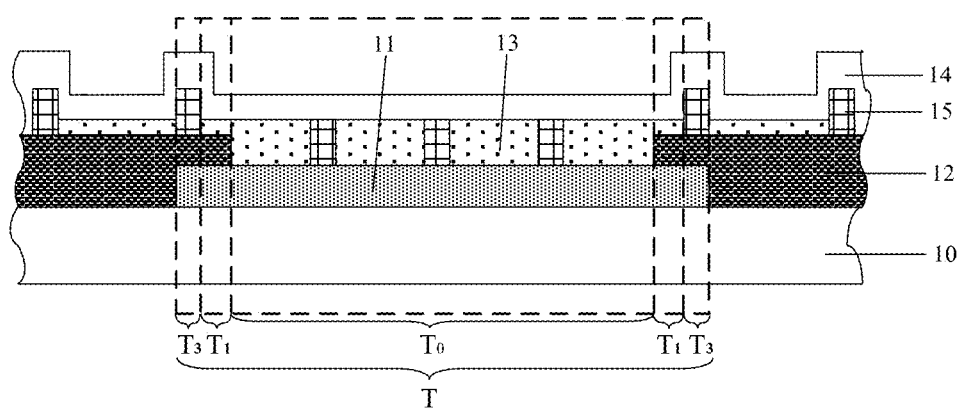
FIG. 8 is another cross-section diagram of the test substrate taken along line C-C' shown in FIG. 5, in accordance with some embodiments.
Figure 9:
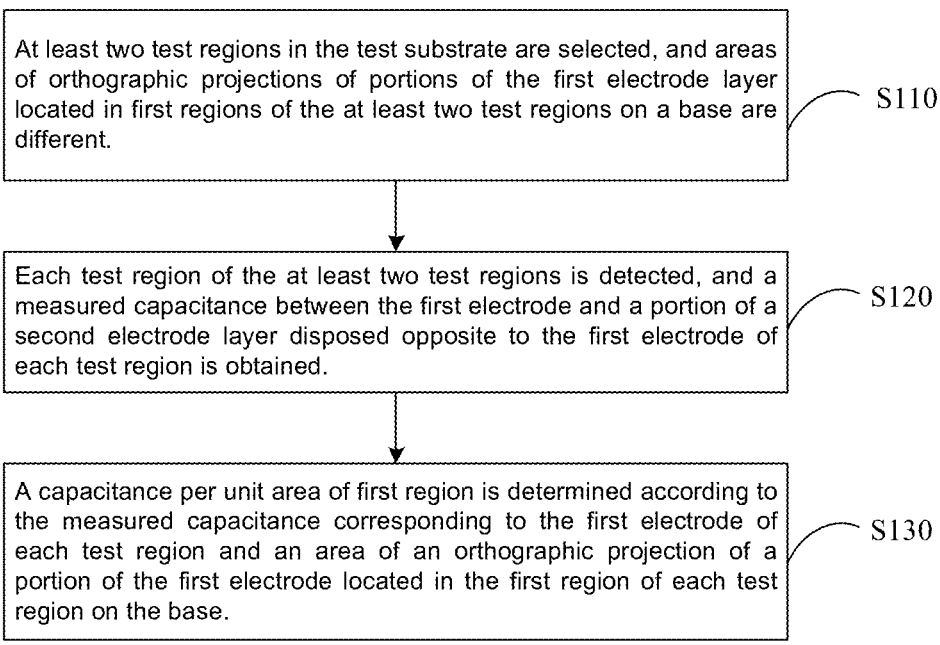
FIG. 9 is a flow diagram of a method of detecting a capacitance of a test substrate, in accordance with some embodiments.

In some embodiments, as shown in FIG. 8, each test region T further includes a third region $T_3$ disposed on a side of the first region $T_1$ away from the open region $T_0$.

Orthographic projections of portions of the pixel defining layer 12 and the plurality of barrier walls 15 located in a same third region $T_3$ on the base 10 overlap. Each of the first electrode layer 11 and the second electrode layer 14 includes portions disposed in the open region $T_0$, the first region $T_1$, the second region $T_2$ and the third region $T_3$, the pixel defining layer 12 includes portions disposed in the first region $T_1$, the second region $T_2$ and the third region $T_3$, the light-emitting functional layer 13 includes portions disposed in the open region $T_0$ and the first region $T_1$, and the plurality of barrier walls 15 include portions disposed in the third region $T_3$ and the open region $T_0$. In some examples, the third region $T_3$ includes one or more third sub-regions, and the position, the shape and the area of each third sub-portion are set according to the settings of the pixel defining layer 12 and the plurality of barrier walls 15 or according to the actual needs.

In addition, since the light-emitting functional layer 13 is disposed in the plurality of regions enclosed by the plurality of barrier walls 15, orthographic projections of portions of the light-emitting functional layer 13 and the plurality of barrier walls 15 located in a same open region $T_0$ on the base 10 do not overlap. That is, each open region $T_0$ includes a first open region $T_{01}$ where all portions of the light-emitting functional layer 13 located in the open region $T_0$ is located and a second open region $T_{02}$ where all portions of the plurality of barrier walls 15 located in the open region $T_0$ are located.

It will be noted that in a case where each test region T in the test substrate further includes the third region $T_3$ and the open region $T_0$ includes the first open region $T_{01}$ and the second open region $T_{02}$, the measured capacitance $C_T$ of the LTC corresponding to the test region T further includes a parasitic capacitance $C_{PDL\&D} \times S_3$ between portions of the first electrode and the second electrode layer 14 located in the third region $T_3$ due to the pixel defining layer 12 and the plurality of barrier walls 15 and a parasitic capacitance $C_{D02} \times S_{02}$ between portions of the first electrode and the second electrode layer 14 located in the second open region $T_{02}$ due to the plurality of barrier walls 15. $S_3$ is an area of an orthographic projection of the third region $T_3$ of the test region T corresponding to the LTC on the base 10, $C_{PDL\&D}$ is a capacitance per unit area of the third region $T_3$ of the test region T corresponding to the LTC. $S_{02}$ is an area of an orthographic projection of the second open region $T_{02}$ of the test region T corresponding to the LTC on the base 10, and $C_{D02}$ is a capacitance per unit area of the second open region $T_{02}$ of the test region T corresponding to the LTC. Thai is, the measured capacitance $C_T$ of the LTC is a sum of a product of $C_{EL01}$ and $S_{01}$, a product of $C_{PDL\&EL}$ and $S_1$, a product of $C_{PDL}$ and $S_2$, a product of $C_{PDL\&D}$ and $S_3$ and a product of $C_{D02}$ and $S_{02}$ ($C_T = C_{EL01} \times S_{01} + C_{PDL\&EL} \times S_1 + C_{PDL} \times S_2 + C_{PDL\&D} \times S_3 + C_{D02} \times S_{02}$), wherein $S_{01}$ is an area of an orthographic projection of the first open region $T_{01}$ of the test region T corresponding to the LTC on the base 10, and $C_{EL01}$ is a capacitance per unit area of the first open region $T_{01}$ of the test region T corresponding to the LTC.

Since the material of the plurality of barrier walls 15 is the same as or different from the material of the pixel defining layer 12, and the impact of the manufacturing process on the dielectric coefficients of the two is negligible, the capacitance per unit area $C_{PDL\&D}$ of the third region $T_3$ and the capacitance per unit area $C_{D02}$ of the second open region $T_{02}$ may be accurately determined according to the dielectric coefficients of the pixel defining layer 12 and the plurality of barrier walls 15, and then a parasitic capacitance $C_{PDL\&D} \times S_3$ of each LTC corresponding to a third region $T_3$ and a parasitic capacitance $C_{D02} \times S_{02}$ of each LTC corresponding to a second open region $T_{02}$ are determined. That is, the parasitic capacitances corresponding to the third region $T_3$ and the second open region $T_{02}$ are effectively extracted, thereby accurately constructing the simulation model corresponding to the test substrate, so as to improve the simulation accuracy of the simulation model.

In some embodiments, with reference to FIG. 6, in at least two test regions T, portions of at least two first electrodes located in corresponding first regions $T_1$ have a different number of through holes. That is, in the portions of the at least two first electrodes located in the corresponding first regions $T_1$, the number of through holes provided in one first electrode is different from the number of through holes provided in other first electrodes. Optionally, each through hole has the same shape and the same size (including the cross-sectional perimeter and the cross-sectional area, etc.).

Based on this, in a process of manufacturing the plurality of first electrodes, graphic designs of the portions of the first electrodes located in the corresponding first regions $T_1$ are not required to be complicated, which is advantageous for reducing a design difficulty and a manufacturing difficulty of the first electrodes, and reducing a manufacturing difficulty of masks required for the first electrodes in a patterning process, thereby saving a cost of manufacturing the test substrate.

Some embodiments of the present disclosure provide a display substrate. The display substrate includes the test substrate according to any embodiment described above. In some embodiments, with reference to FIG. 17, the display substrate 1001 has a display function, and the plurality of first electrodes of the first electrode layer 11 of the display substrate 1001 are pixel electrodes. The display substrate 1001 further includes a pixel circuit layer 16 disposed between the first electrode layer 11 and the base 10. The pixel circuit layer 16 includes a plurality of pixel driving circuits disposed in one-to-one correspondence with the plurality of first electrodes, and each pixel driving circuit includes a driving transistor. The display substrate provided by the embodiments of the present disclosure has a same test function and same technical effects as the test substrate described above, which are not described herein again.

Figure 18:
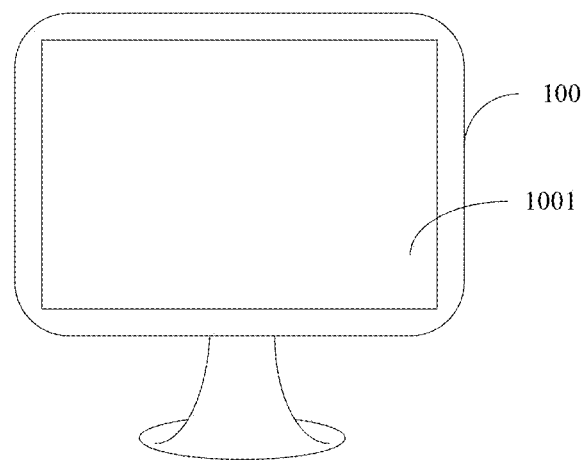
FIG. 18 is a schematic structural diagram of a display device, in accordance with some embodiments.

Some embodiments of the present disclosure provide a display device. With reference to FIG. 18, the display device 100 includes the display substrate 1001 according to any embodiment described above. The display device is a display panel, such as an OLED display panel. In some other examples, the display device is a display including a display panel. The display device provided by the embodiments of the present disclosure has the same technical effects as the display substrate described above, which is not described herein again.

Some embodiments of the present disclosure provide a detection method for detecting a capacitance of the test substrate according to any embodiment described above. With reference to FIGS. 9 and 1-3, the detection method includes S110-S130.

In S110, at least two test regions T are selected in the test substrate, and areas of orthographic projections of portions of at least two first electrodes located in first regions $T_1$ of the at least two test regions T on a base 10 are different.

For example, the areas of the orthographic projections of the first regions $T_1$ of the at least two test regions T on the base 10 are different. In addition, In some examples, in the selected at least two test regions T, contact areas of the first electrodes in different test regions T and the light-emitting functional layer 13 are the same.

In S120, each test region T of the at least two test regions T is detected, and a measured capacitance between a first electrode and a portion of the second electrode layer 14 disposed opposite to the first electrode in each test region T is obtained.

Portions of the test substrate located in each test region T (including at least portions of the first electrode layer 11, the pixel defining layer 12, the light-emitting functional layer 13 and the second electrode layer 14 located in the test region T) correspond to a life test cell (abbreviated as LTC). The LTC may be used to test electrical, optical and lifetime properties of the test substrate.

Here, the LTCs corresponding to the test regions T are configured to test the capacitance of the test substrate. In each test region T, the first electrode and the second electrode layer 14 have different potentials, the first electrode and the portion of the second electrode layer 14 disposed opposite to the first electrode form a capacitor, and a capacitance of the capacitor is a measured capacitance of a LTC corresponding to the test region T. A capacitance between portions of the first electrode and the second electrode layer 14 located in the open region $T_0$ due to the light-emitting functional layer 13 is an effective capacitance of the LTC, and a capacitance between portions of the first electrode and the second electrode layer 14 located in the first region $T_1$ due to the pixel defining layer 12 and the light-emitting functional layer 13 is a parasitic capacitance of the LTC.

It will be noted that the measured capacitance of any LTC described above may be directly measured by a capacitance measuring device such as a multimeter. In addition, the measured capacitance of any LTC in the test substrate needs to be measured when the LTC is in an off state. The fact that the LTC is in an off state means that the first electrode and the second electrode layer 14 have different potentials, and a portion of the light-emitting functional layer 13 located in the LTC is in a non-light-emitting state.

In S130, a capacitance per unit area of first region $T_1$ of any test region T is determined according to the measured capacitance corresponding to a first electrode of each test region T and an area of an orthographic projection of a portion of the first electrode located in the first region $T_1$ on the base 10.

Here, the measured capacitance corresponding to the first electrode is the measured capacitance $C_T$ of the LTC including the first electrode. The capacitance per unit area of first region $T_1$ do not specifically refer to the capacitance per unit area of a first region $T_1$ of a certain test region T, but refer to the capacitance per unit area capable of representing the capacitance per unit area of any first region $T_1$ in the test substrate.

After the measured capacitance corresponding to the first electrode of each test region T and the area of the orthographic projection of the portion of the first electrode located in the first region $T_1$ of the test region T on the base 10 are known, the capacitance per unit area of first region $T_1$ may be determined according to the calculation formula of the measured capacitance of the LTC in some embodiments described above.

The method of detecting the capacitance of the test substrate provided by the embodiments of the present disclosure has the same technical effects as the test substrate described above, which is not described herein again.

Figure 10:
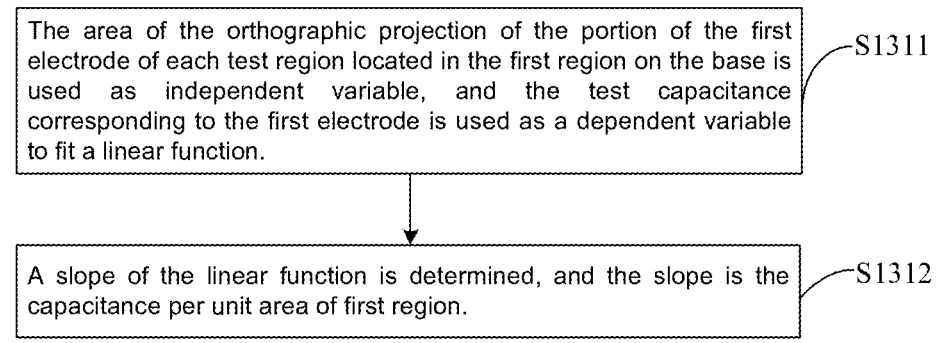
FIG. 10 is a flow diagram showing steps of determining capacitance per unit area of first region, in accordance with some embodiments.

In some embodiments, as shown in FIG. 10, the S130, in which the capacitance per unit area of first region $T_1$ of any test region T is determined, includes S1311-S1312.

In S1311, the area of the orthographic projection of the portion of the first electrode located in a first region of each test region T on the base 10 is used as an independent variable, and the measured capacitance corresponding to the first electrode is used as a dependent variable to fit a linear function.

Optionally, the number of test regions T is greater than or equal to 3, which is advantageous for improving a fitting accuracy of the linear function described above.

In S1312, a slope of the linear function is determined, and the slope is the capacitance per unit area of first region.

Figure 11:
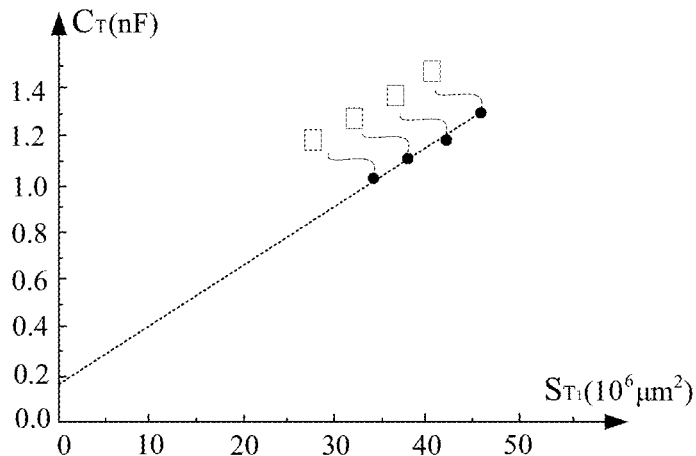
FIG. 11 is a schematic diagram of a linear function in the steps shown in FIG. 10, in accordance with some embodiments.

For example, with reference to FIG. 11, four test regions are selected from the test substrate, which are a first test region ①, a second test region ②, a third test region ③ and a fourth test region ④, respectively. Contact areas of the first electrodes of the test regions (①, ②, ③ and ④) and the light-emitting functional layer are the same. In the first test region ①, an area of an orthographic projection of a portion of the first electrode in the first region $T_1$ on the base 10 is $34 \times 10^6$ $\mu m^2$. In the second test region ②, an area of an orthographic projection of a portion of the first electrode located in the first region $T_1$ on the base 10 is $38 \times 10^6$ $\mu m^2$. In the third test region ③, an area of an orthographic projection of a portion of the first electrode located in the first region $T_1$ on the base 10 is $42 \times 10^6$ $\mu m^2$. In the fourth test region ④, an area of an orthographic projection of a portion of the first electrode located in the first region $T_1$ on the base 10 is $46 \times 10^6$ $\mu m^2$.

It may be obtained by detecting the test regions (①, ②, ③ and ④) that a measured capacitance between the first electrode and the portion of the second electrode layer 14 disposed opposite to the first electrode in the first test region ① is 1.02 nF, a measured capacitance between the first electrode and the portion of the second electrode layer 14 disposed opposite to the first electrode in the second test region ② is 1.11 nF, a measured capacitance between the first electrode and the portion of the second electrode layer 14 disposed opposite to the first electrode in the third test region ③ is 1.18 nF, and a measured capacitance between the first electrode and the portion of the second electrode layer 14 disposed opposite to the first electrode in the fourth test region ④ is 1.30 nF.

The area $S_{T1}$ of the orthographic projection of the portion of the first electrode located in the first region $T_1$ of each test region on the base 10 is the abscissa, and the measured capacitance $C_T$ corresponding to the first electrode is the ordinate to establish a coordinate system. Moreover, corresponding values of the first test region ①, the second test region ②, the third test region ③ and the fourth test region ④ are traced in the coordinate system, respectively, so that the fitted linear function, that is, y being a sum of a product of k and x, and C (y=kx+C), may be obtained according to the four points shown in FIG. 11, wherein the slope k is the capacitance per unit area of first region $T_1$.

In the embodiments of the present disclosure, a relatively accurate linear function may be effectively fitted according to tested data corresponding to a plurality of test regions T (including the area of the orthographic projection of the portion of the first electrode located in the first region $T_1$ of each test region T on the base 10 and the measured capacitance corresponding to the first electrode), thereby obtaining relatively accurate capacitance per unit area of first region $T_1$. Of course, the more the number of the selected test regions T, the more accurate the linear function obtained by fitting.

Figure 12:
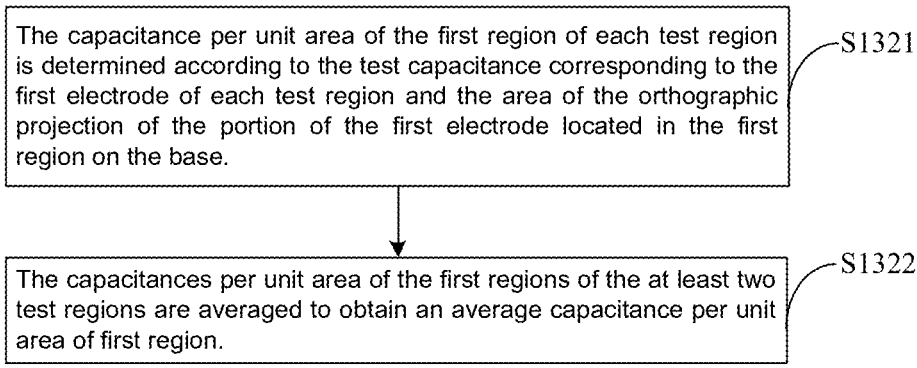
FIG. 12 is another flow diagram showing steps of determining capacitance per unit area of first region, in accordance with some embodiments.
Figure 13:
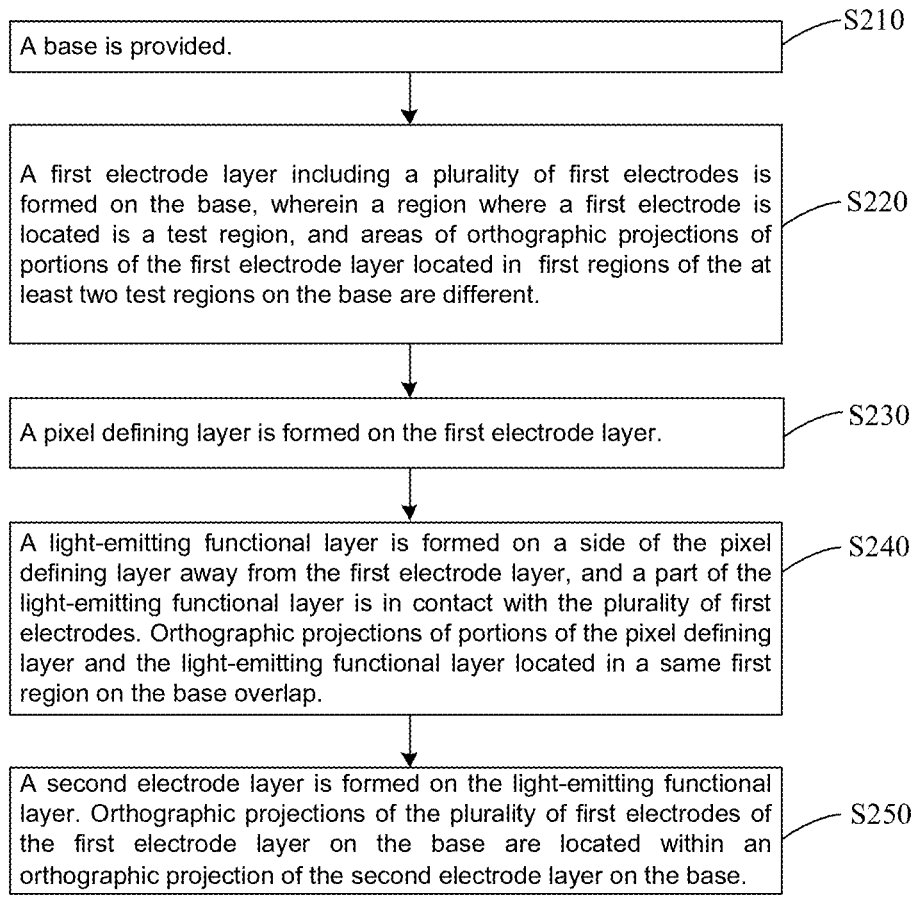
FIG. 13 is a flow diagram of a method of manufacturing a test substrate, in accordance with some embodiments.

In some other embodiments, as shown in FIG. 12, the S130, in which the capacitance per unit area of first region $T_1$ of any test region T is determined, includes S1311-S1312.

In S1311, a capacitance per unit area of a first region $T_1$ of each test region T is determined according to the measured capacitance corresponding to the first electrode of the test region T and the area of the orthographic projection of the portion of the first electrode located in the first region $T_1$ on the base 10.

It will be noted that the capacitance per unit area of the first region $T_1$ of each test region T determined herein is not the capacitance per unit area of first region $T_1$ determined in the S130 described above. Optionally, the number of the test regions T is greater than or equal to 3.

In S1322, capacitances per unit area of first regions $T_1$ of at least two test regions are averaged to obtain an average capacitance per unit area of first region $T_1$.

After averaging the capacitances per unit area of the first regions $T_1$, the average capacitance per unit area of first region $T_1$ obtained is capable of representing the capacitance per unit area of any first region $T_1$ in the test substrate.

For example, three test regions are selected from the test substrate, which are the first test region ①, the second test region ② and the third test region ③, respectively. It is determined one by one that the capacitance per unit area of the first region $T_1$ of the first test region ① is $C_{PDL\&EL1}$, the capacitance per unit area of the first region $T_1$ of the second test region ② is $C_{PDL\&EL2}$, and the capacitance per unit area of the first region $T_1$ of the third test region ③ is $C_{PDL\&EL3}$. Then, it may be obtained by averaging $C_{PDL\&EL1}$, $C_{PDL\&EL2}$ and $C_{PDL\&EL3}$ that the average capacitance per unit area of first region $T_1$ $C_{PDL\&EL}$ is a quotient of a sum of $C_{PDL\&EL1}$ and C and $C_{PDL\&EL3}$ divided by 3 ($C_{PDL\&EL}=(C_{PDL\&EL1}+C_{PDL\&EL2}+C_{PDL\&EL3})/3$).

In the embodiments of the present disclosure, the capacitance per unit area of any first region $T_1$ in the test substrate may be obtained by averaging according to the capacitance per unit area of the first region $T_1$ of each test region T of the plurality of test regions T, and the relatively accurate capacitance per unit area of first region $T_1$ may be obtained.

It will be understood that in some embodiments, if each test region T of the test substrate further includes the second region $T_2$ or the third region $T_3$ according to some embodiments described above, capacitance per unit area of second region $T_2$ or capacitance per unit area of third region $T_3$ may be determined with reference to the method of determining the capacitance per unit area of first region $T_1$ described above and the calculation formulas of corresponding measured capacitances $C_T$ in some embodiments described above, which are not described herein again.

Some embodiments of the present disclosure provide a method of manufacturing a test substrate. The test substrate is, for example, the test substrate described in any embodiment described above. With reference to FIGS. 13 and 1-4, the manufacturing method includes S210-S250.

In S210, a base 10 is provided.

Figure 17:
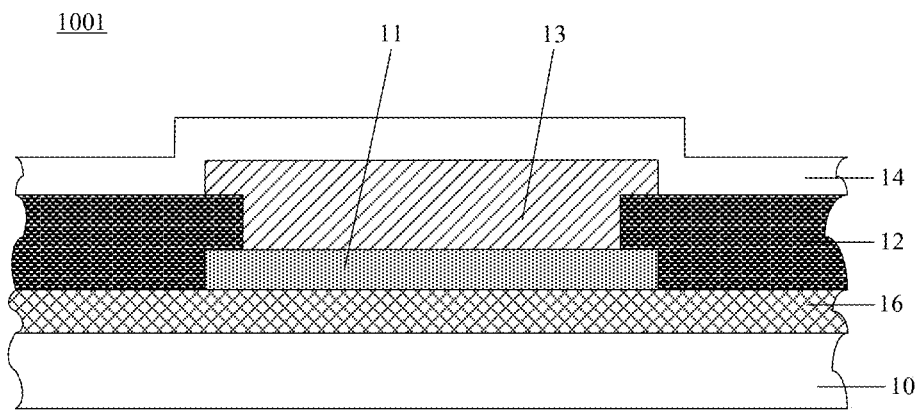
FIG. 17 is a partial cross-section diagram of a display substrate, in accordance with some embodiments.

In some examples, as shown in FIG. 1, the base 10 is a blank base on which no electronic devices or circuit structures are fabricated. In some other examples, as shown in FIG. 17, the base 10 is a base on which a pixel circuit layer 16 is located, and the pixel circuit layer 16 includes a plurality of pixel driving circuits disposed in one-to-one correspondence with a plurality of first electrodes.

In S220, a first electrode layer 11 including the plurality of first electrodes is formed on the base 10, wherein a region where a first electrode is located is a test region T, and areas of orthographic projections of portions of at least two first electrodes located in first regions $T_1$ of at least two test regions T on the base 10 are different.

In some examples, the plurality of first electrodes of the first electrode layer 11 have the same shape.

In S230, a pixel defining layer 12 is formed on the first electrode layer 11.

In some embodiments, the S230 includes: forming the pixel defining layer 12 on a surface of the base 10 not covered by the plurality of first electrodes of the first electrode layer 11 and surfaces of the plurality of first electrodes away from the base 10, and forming a plurality of openings in one-to-one correspondence with the plurality of first electrodes in the pixel defining layer 12, wherein portions of the first electrode covered by the pixel defining layer 12 in a test region T are located in the first region $T_1$ and the second region $T_2$ of the test region T respectively.

In S240, a light-emitting functional layer 13 is formed on a side of the pixel defining layer 12 away from the first electrode layer 11, and the light-emitting functional layer 13 is in contact with the plurality of first electrodes. Orthographic projections of portions of the pixel defining layer 12 and the light-emitting functional layer 13 located in a same first region $T_1$ on the base 10 overlap with each other. An orthographic projection of the light-emitting functional layer 13 on the base 10 is located outside an orthographic projection of the second region 12 on the base 10.

In some embodiments, the S240 includes: forming the light-emitting functional layer 13 on surfaces of the plurality of first electrodes of the first electrode layer 11 not covered by the pixel defining layer 12 and a part of a surface of the pixel defining layer 12 away from the base 10. A portion of the light-emitting functional layer 13 covering the first electrode in a test region T is located in the open region $T_0$ of the test region T, and areas of orthographic projections of the open regions $T_0$ of different test regions T on the base 10 are the same.

In S250, a second electrode layer 14 is formed on the light-emitting functional layer 13. Orthographic projections of the plurality of first electrodes of the first electrode layer 11 on the base 10 are located within an orthographic projection of the second electrode layer 14 on the base 10.

In some examples, the second electrode layer 14 includes a plurality of second electrodes in one-to-one correspondence with the plurality of first electrodes. An orthographic projection of each first electrode on the base 10 is located within an orthographic projection of a corresponding second electrode on the base 10. In some other examples, the second electrode layer 14 is an entire conductive film covering a surface of the light-emitting functional layer 13 away from the base 10 and a surface of the pixel defining layer 12 not covered by the light-emitting functional layer 13.

The method of manufacturing the test substrate provided by the embodiments of the present disclosure has the same technical effects as the test substrate described above, which is not described herein again.

Figure 14:
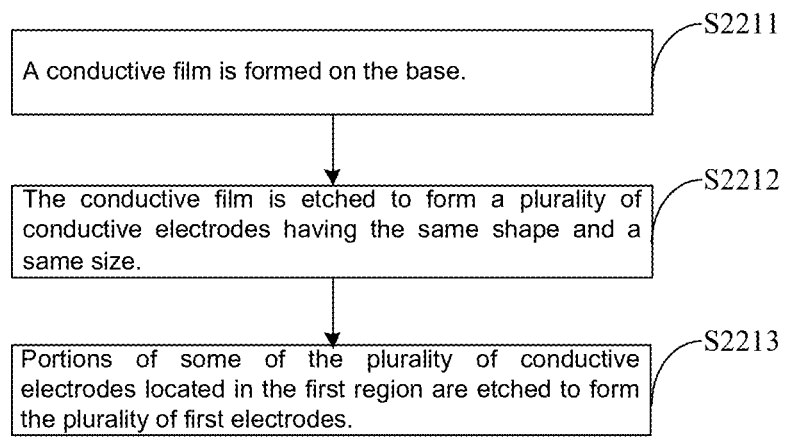
FIG. 14 is a flow diagram of manufacturing a first electrode layer, in accordance with some embodiments.

In some embodiments, as shown in FIG. 14, S220 includes S2211-S2213.

In S2211, a conductive film is formed on the base 10.

In S2212, the conductive film is etched to form a plurality of conductive electrodes having the same shape and a same size.

In S2213, portions of some of the plurality of conductive electrodes located in first regions $T_1$ are etched to form the plurality of first electrodes.

Here, etching the portions of the plurality of conductive electrodes located in the first regions $T_1$ by using a mask may be etching different numbers of through holes in the portions of the first electrodes located in the first regions $T_1$. That is, in the portions of the first electrodes located in the first regions $T_1$, the number of through holes etched in one first electrode is controlled to be different from the number of through holes etched in other first electrodes. Thus, under a premise of ensuring that the areas of the orthographic projections of the portions of the first electrodes located in the first regions $T_1$ on the base 10 are different, graphic designs of the portions of the first electrodes located in the first regions $T_1$ are not required to be complicated, which is advantageous for reducing a design difficulty and a manufacturing difficulty of the first electrodes, and reducing a manufacturing difficulty of masks required for the first electrodes in a patterning process, thereby saving a cost of manufacturing the test substrate.

Figure 15:
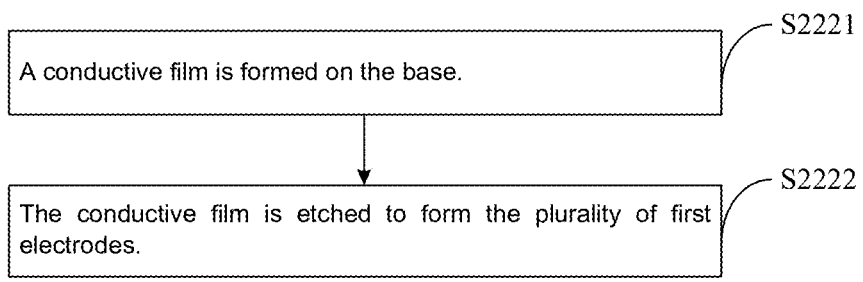
FIG. 15 is another flow diagram of manufacturing a first electrode layer, in accordance with some embodiments.
Figure 16:
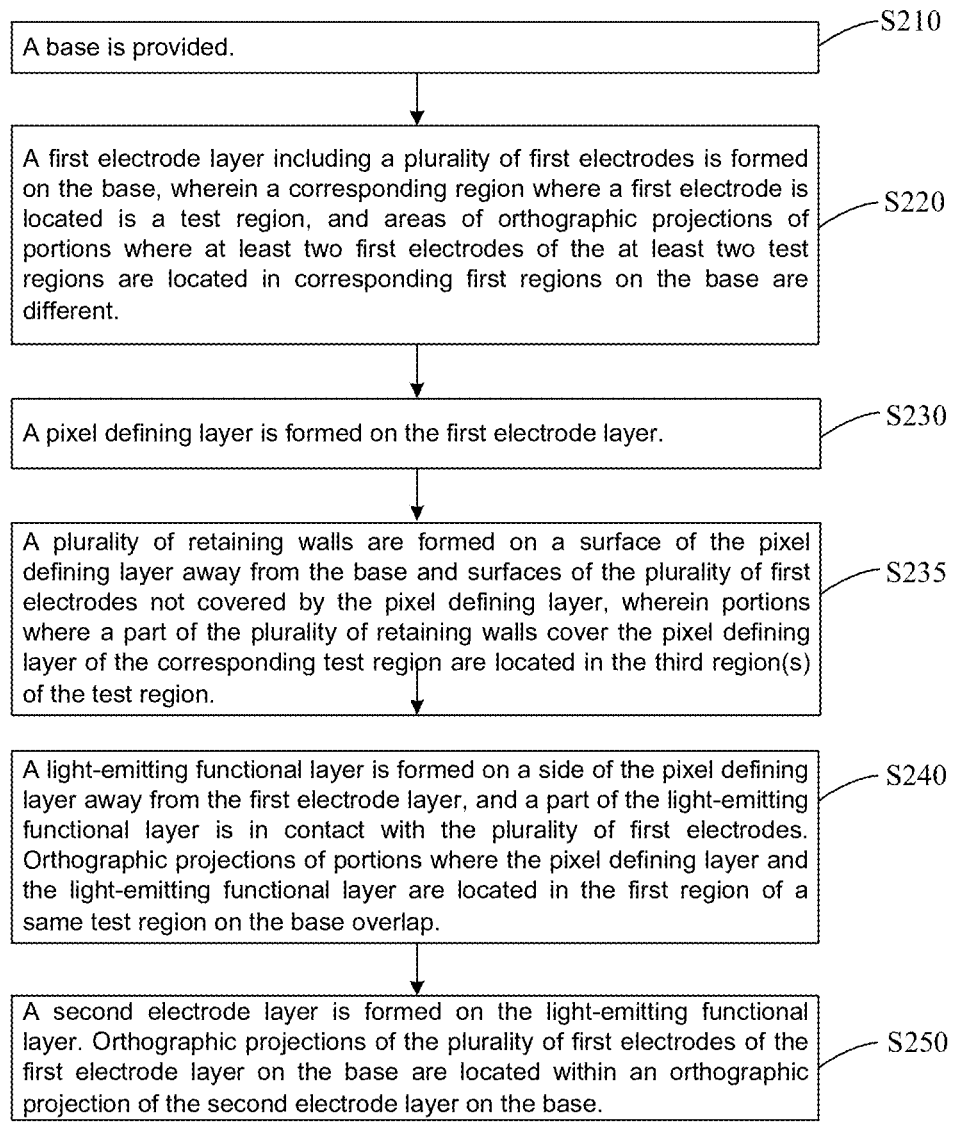
FIG. 16 is a flow diagram of another method of manufacturing a test substrate, in accordance with some embodiments.

In some other embodiments, as shown in FIG. 15, S220 includes S2221-S2222.

In S2221, a conductive film is formed on the base 10.

In S2222, the conductive film is etched to form the plurality of first electrodes.

Here, the first electrode layer 11 including the plurality of first electrodes may be formed by etching the conductive film once by using a mask, and the areas of the orthographic projections of the portions of at least two first electrodes located in the first regions $T_1$ on the base 10 are different, which is advantageous for reducing the number of etchings and simplifying a process of manufacturing the first electrode layer 11.

In some embodiments, as shown in FIGS. 16 and 5-7, after forming the pixel defining layer 12 and before forming the light-emitting functional layer 13, the method further includes S235.

In S235, a plurality of barrier walls 15 are formed on a surface of the pixel defining layer 12 away from the base 10 and surfaces of the plurality of first electrodes not covered by the pixel defining layer 12, wherein a portion of the plurality of barrier walls 15 covering the pixel defining layer 12 in a test region T is located in the third region 13 of the test region T.

Correspondingly, in a case where the light-emitting functional layer 13 includes a plurality of light-emitting films, the S240, in which the light-emitting functional layer 13 is formed on the side of the pixel defining layer 12 away from the first electrode layer 11, further includes: forming a light-emitting film in each of at least one region of the plurality of regions enclosed by the plurality of barrier walls 15.

In some embodiments, a shape of each barrier wall 15 is set according to actual needs. For example, the barrier walls 15 are strip-shaped, and every four barrier walls 15 are connected in sequence end to end to enclose a closed region configured to accommodate a corresponding light-emitting film. For another example, each barrier wall 15 has an annular shape, and each annular barrier wall encloses a closed region configured to accommodate a corresponding light-emitting film.

Some embodiments of the present disclosure do not limit positions of the plurality of barrier walls 15. For example, the plurality of barrier walls 15 are formed in the test regions T, or the plurality of barrier walls 15 are formed in the test regions T and regions of the test substrate other than the test regions T. In addition, some embodiments of the present disclosure do not limit a material of the plurality of barrier walls 15. For example, the material of the plurality of barrier walls 15 is the same as or different from a material of the pixel defining layer 12. Optionally, the plurality of barrier walls 15 are made of an insulating material. Optionally, the plurality of barrier walls 15 are integrally formed with the pixel defining layer 12.

In the embodiments of the present disclosure, forming the plurality of barrier walls 15 in the test substrate facilitates manufacturing the light-emitting functional layer 13 by using an inkjet printing process. Since in a process of manufacturing the light-emitting functional layer 13 through the inkjet printing process, a molding thickness of the light-emitting functional layer 13 is easily affected by a flatness of a film layer disposed on a side of the light-emitting functional layer 13 close to the base 10 (for example, the first electrode layer 11 or the pixel defining layer 13), the at least one printing ink droplet of the light-emitting functional layer 13 may be dropped as required in each region enclosed by barrier walls 15 by using the plurality of barrier walls 15, so as to ensure that a thickness of the light-emitting film of the light-emitting functional layer 13 that is located in each region tends to be consistent (substantially the same), thereby ensuring that a thickness of an entire light-emitting functional layer 13 tends to be consistent.

In addition, in a case where the plurality of barrier walls 15 are formed in the test substrate, the first region $T_1$ of each test region T may be divided into a plurality of smaller block-shaped regions by the plurality of barrier walls 15. Based on this, as shown in FIG. 6, areas of orthographic projections of portions of the first electrodes of different test regions $T_1$ located in the first regions $T_1$ may be different by means of digging holes.

In the description of the above embodiments, specific features, structures, materials or characteristics may be combined in any suitable manner in any one or more embodiments or examples.

The foregoing descriptions are merely some implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A test substrate, comprising:
a base; and
a first electrode layer, a pixel defining layer, a light-emitting functional layer and a second electrode layer disposed on the base in sequence, wherein the first electrode layer includes a plurality of first electrodes, a portion of each first electrode is in contact with the light-emitting functional layer, and orthographic projections of the plurality of first electrodes on the base are located within an orthographic projection of the second electrode layer on the base;
the test substrate has at least two test regions, wherein each test region is a region where a first electrode of the plurality of first electrodes is located; and each test region includes a first region, and orthographic projections of portions of the pixel defining layer and the light-emitting functional layer located in a same first region on the base overlap with each other; and
areas of orthographic projections of portions of the first electrode layer located in first regions of the at least two test regions on the base are different.

2. The test substrate according to claim 1, wherein contact areas of at least two first electrodes in the at least two test regions and the light-emitting functional layer are the same.

3. The test substrate according to claim 1, wherein the pixel defining layer is provided with a plurality of openings in one-to-one correspondence with the plurality of first electrodes, and a portion of the light-emitting functional layer is filled in each of the plurality of openings; and
each test region further includes an open region and a second region disposed on a side of the first region away from the open region; and an orthographic projection of the pixel defining layer on the base is located outside an orthographic projection of the open region on the base, and an orthographic projection of the light-emitting functional layer on the base is located outside an orthographic projection of the second region on the base.

4. The test substrate according to claim 3, wherein areas of orthographic projections of at least two open regions of the at least two test regions on the base are the same.

5. The test substrate according to claim 1, further comprising a plurality of barrier walls configured to enclose a plurality of regions, wherein the plurality of barrier walls are disposed on a surface of the pixel defining layer away from the base and a surface of the first electrode layer away from the base and not covered by the pixel defining layer, respectively; and
the light-emitting functional layer includes a plurality of light-emitting films, and one of the plurality of light-emitting films is disposed in a corresponding region of the plurality of regions enclosed by the plurality of barrier walls.

6. The test substrate according to claim 5, wherein each test region further includes a third region; and orthogonal projections of portions of the pixel defining layer and the plurality of barrier walls located in a same third region on the base overlap with each other.

7. The test substrate according to claim 1, wherein the portions of the first electrode layer located in the first regions of the at least two test regions are provided with different numbers of through holes.

8. The test substrate according to claim 7, wherein the through holes have a same shape and a same size.

9. A display substrate, comprising the test substrate according to claim 1.

10. A display device, comprising the display substrate according to claim 9.

11. A detection method for detecting a capacitance of the test substrate according to claim 1, the detection method comprising:
selecting at least two test regions in the test substrate, wherein areas of orthogonal projections of portions of the first electrode layer located in first regions of the at least two test regions on the base are different;
detecting each test region of the at least two test regions, and obtaining a measured capacitance between a first electrode and a portion of a second electrode layer disposed opposite to the first electrode in each test region; and
determining a capacitance per unit area of first region according to the measured capacitance corresponding to the first electrode in each test region and an area of orthographic projection of a portion of the first electrode located in a first region of each test region on the base.

12. The detection method according to claim 11, wherein in the at least two test regions, contact areas of first electrodes in different test regions and the light-emitting functional layer are the same.

13. The detection method according to claim 12, wherein determining the capacitance per unit area of first region, includes:
using the area of the orthographic projection of the portion of the first electrode located in the first region of each test region on the base as an independent variable, and using the measured capacitance corresponding to the first electrode in each test region as a dependent variable to fit a linear function; and
determining a slope of the linear function, and the slope being the capacitance per unit area of first region.

14. The detection method according to claim 12, wherein determining the capacitance per unit area of first region, includes:
determining the capacitance per unit area of the first region of each test region according to the measured capacitance corresponding to the first electrode of each test region and the area of the orthographic projection of the portion of the first electrode located in the first region on the base; and
averaging capacitances per unit area of first regions of the at least two test regions to obtain an average capacitance per unit area of first region.

15. A method of manufacturing the test substrate according to claim 1, comprising:
providing the base;
forming the first electrode layer on the base, wherein the first electrode layer includes a plurality of first electrodes;
forming a pixel defining layer on the first electrode layer;
forming a light-emitting functional layer on a side of the pixel defining layer away from the first electrode layer, wherein a portion of each first electrode is in contact with the light-emitting functional layer; and
forming a second electrode layer on the light-emitting functional layer, wherein orthographic projections of the plurality of first electrodes on the base are located within an orthographic projection of the second electrode layer on the base, wherein
a region where a first electrode is located is a test region, and the test region includes a first region, orthographic projections of portions of the pixel defining layer and the light-emitting functional layer located in a same first region on the base overlap with each other, and areas of orthographic projections of portions of the first electrode layer located in first regions of at least two test regions on the base are different.

16. The manufacturing method according to claim 15, wherein forming the first electrode layer on the base, includes:
forming a conductive film on the base;
etching the conductive film to form a plurality of conductive electrodes having a same shape and a same size; and
etching portions of some of the plurality of conductive electrodes located in corresponding first regions to form the plurality of first electrodes.

17. The manufacturing method according to claim 15, wherein forming the first electrode layer on the base, includes:
forming a conductive film on the base; and
etching the conductive film to form the plurality of first electrodes.

18. The manufacturing method according to claim 15, wherein forming the pixel defining layer on the first electrode layer, includes:
- forming the pixel defining layer on a surface of the base not covered by the plurality of first electrodes and surfaces of the plurality of first electrodes away from the base, and forming a plurality of openings in one-to-one correspondence with the plurality of first electrodes in the pixel defining layer, wherein
- a portion of the pixel defining layer covering the first electrode located in a corresponding test region is located in a first region and a second region of the test region; and an orthographic projection of the light-emitting functional layer on the base is located outside an orthographic projection of the second region on the base.

19. The manufacturing method according to claim 18, wherein forming the light- emitting functional layer on the side of the pixel defining layer away from the first electrode layer, includes:
- forming the light-emitting functional layer on surfaces of the plurality of first electrodes that are not covered by the pixel defining layer and a part of a surface of the pixel defining layer away from the base, wherein
- a portion of the light-emitting functional layer covering a first electrode of a corresponding test region is located in an open region of the test region; and areas of orthographic projections of open regions of different test regions on the base are the same.

20. The manufacturing method according to claim 15, wherein after forming the pixel defining layer and before forming the light-emitting functional layer, the method further comprises:
- forming a plurality of barrier walls on a surface of the pixel defining layer away from the base and surfaces of the plurality of first electrodes not covered by the pixel defining layer, wherein
- the light-emitting functional layer includes a plurality of light-emitting films; and forming the light-emitting functional layer on the side of the pixel defining layer away from the first electrode layer, includes:
- forming a light-emitting film in each of at least one of a plurality of regions enclosed by the plurality of barrier walls, wherein
- portions of the plurality of barrier walls corresponding to the pixel defining layer in a corresponding test region are located in a third region of the test region.

* * * * *

UNITED STATES PATENT AND TRADEMARK OFFICE
CERTIFICATE OF CORRECTION

PATENT NO. : 10,784,445 B2
APPLICATION NO. : 16/405726
DATED : September 22, 2020
INVENTOR(S) : Ling Wang et al.

It is certified that error appears in the above-identified patent and that said Letters Patent is hereby corrected as shown below:

In the Specification

In Column 16, Line 26, please replace with the following paragraph:
In S240, a light-emitting functional layer 13 is formed on a side of the pixel defining layer 12 away from the first electrode layer 11, and the light-emitting functional layer 13 is in contact with the plurality of first electrodes. Orthographic projections of portions of the pixel defining layer 12 and the light-emitting functional layer 13 located in a same first region $T_1$ on the base 10 overlap with each other. An orthographic projection of the light-emitting functional layer 13 on the base 10 is located outside an orthographic projection of the second region $T_2$ on the base 10.

In Column 17, Line 34, please replace with the following paragraph:
In S235, a plurality of barrier walls 15 are formed on a surface of the pixel defining layer 12 away from the base 10 and surfaces of the plurality of first electrodes not covered by the pixel defining layer 12, wherein a portion of the plurality of barrier walls 15 covering the pixel defining layer 12 in a test region T is located in the third region $T_3$ of the test region T.

Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*